US008335113B2

(12) United States Patent
Terauchi

(10) Patent No.: US 8,335,113 B2
(45) Date of Patent: Dec. 18, 2012

(54) FLASH MEMORY AND DATA ERASING METHOD OF THE SAME

(75) Inventor: Youji Terauchi, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 227 days.

(21) Appl. No.: 12/751,260

(22) Filed: Mar. 31, 2010

(65) Prior Publication Data
US 2010/0259994 A1 Oct. 14, 2010

(30) Foreign Application Priority Data

Apr. 9, 2009 (JP) ................................. 2009-095226

(51) Int. Cl.
G11C 16/06 (2006.01)
G11C 16/16 (2006.01)
(52) U.S. Cl. ............................ 365/185.22; 365/185.33
(58) Field of Classification Search ............. 365/185.22, 365/185.33
See application file for complete search history.

(56) References Cited

U.S. PATENT DOCUMENTS

| 6,137,729 | A  | * | 10/2000 | Choi ........................ 365/185.29 |
| 6,856,548 | B2 | * | 2/2005  | Tanzawa et al. .......... 365/185.22 |
| 7,403,430 | B2 | * | 7/2008  | Liu et al. ................... 365/185.33 |
| 7,630,255 | B2 |   | 12/2009 | Yang |

FOREIGN PATENT DOCUMENTS

| JP | 2007-323716 A | 12/2007 |
| JP | 2008-165960 A | 7/2008 |

* cited by examiner

Primary Examiner — Haoi V Ho
Assistant Examiner — Tri Hoang
(74) Attorney, Agent, or Firm — Foley & Lardner LLP

(57) ABSTRACT

When data erasure of a flash memory is interrupted and restarted from the interrupted point, time required for the data erasure is shortened. A flash memory includes a memory cell(s), a verification circuit, and a power supply circuit. The verification circuit measures a threshold voltage of the memory cell(s) by verifying an erasure state of the memory cell(s). The power supply circuit applies, to the memory cell(s), one or more pulse voltages whose initial pulse voltage has a strength that corresponds to the measured threshold voltage.

6 Claims, 7 Drawing Sheets

FIG. 7A  RELATED ART
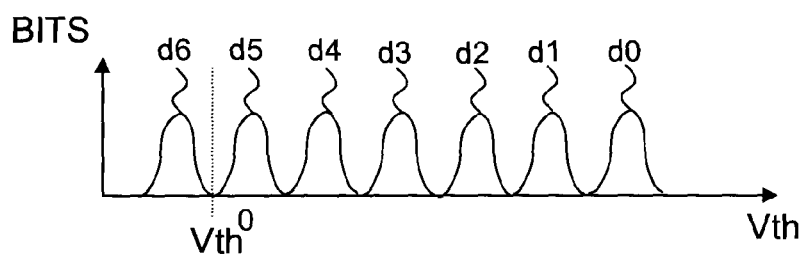 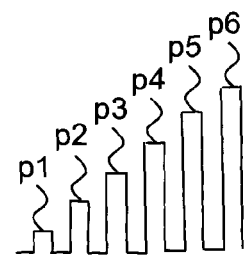
FIG. 7B  RELATED ART
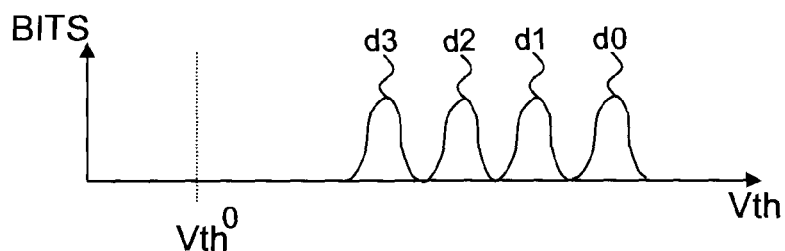 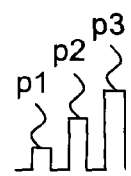
FIG. 7C  RELATED ART
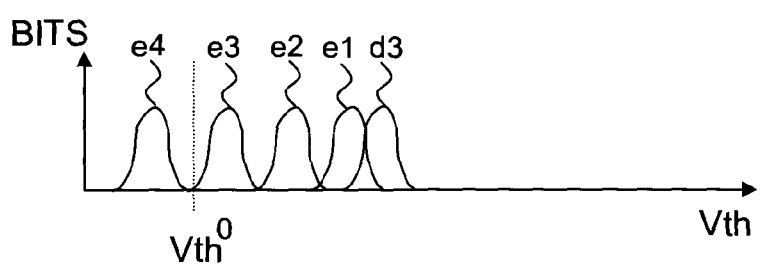 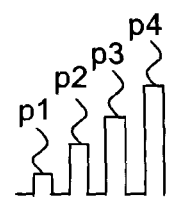

FLASH MEMORY AND DATA ERASING METHOD OF THE SAME

TECHNICAL FIELD

Reference To Related Application

This application is based upon and claims the benefit of the priority of Japanese patent application No. 2009-095226, filed on Apr. 9, 2009, the disclosure of which is incorporated herein in its entirety by reference thereto.

The present invention relates to a flash memory and a method of erasing a flash memory, and in particular, to a method of erasing a flush memory when the erasure is interrupted and restarted from the interrupted point.

BACKGROUND ART

Data erasing methods for flash memory are described in Patent Documents 1 and 2. FIG. 6 is a flow chart schematically showing an erase operation in Patent Documents 1 and 2.

With reference to FIG. 6, in a case where data erasure of the flash memory is started, initially, a pulse voltage of a prescribed strength that is independent of a threshold voltage of a memory cell is applied to the memory cell (step S101).

Next, the threshold voltage of the memory cell is determined (step S102). The determination uses an arbitrarily set verify voltage, and employs an erase verify operation (that is, verification of an erased state). In a case where the threshold voltage is not greater than a prescribed voltage (hereinafter termed "erase level"), the memory cell is determined to be in an erased state (Yes in step S102). On the other hand, in a case where the memory cell is determined to be in a non-erased state (No in step S102), a pulse voltage for erasure corresponding to the threshold voltage of the memory cell is applied to the flash memory (step S103).

FIGS. 7A-7C are drawings for describing a conventional data erasing method of a flash memory. FIGS. 7A to 7C schematically show memory cell threshold voltage distribution and data erase pulse voltage.

With reference to FIG. 7A, the threshold voltage distribution d0 is a threshold voltage distribution of a memory cell before starting data erasure. By applying a pulse voltage p1 to the memory cell (step S101), the threshold voltage distribution changes from the threshold voltage distribution d0 to the threshold voltage distribution d1. Next, by sequentially applying pulse voltages p2 to p6 corresponding to threshold voltage (step S103), the threshold voltage distribution sequentially changes to the threshold voltage distributions d2 to d6. At a point in time at which the threshold voltage distribution is d6, when the threshold voltage of the memory cell is determined (step S102), the threshold voltage distribution d6 is not greater than the erase level Vth0 (Yes in step S102), the memory cell is regarded as being in an erased state, and data erasure is completed.

In Patent Documents 1 and 2, by applying the erase pulse voltage corresponding to the threshold voltage of the memory cell, variation in erase time is reduced, erase speed is improved, and excessive voltage stress is not applied to the flash memory.

Patent Document 1:
JP Patent Kokai Publication No. JP2007-323716A
Patent Document 2:
JP Patent Kokai Publication No. JP2008-165960A

SUMMARY

The entire disclosures of Patent Documents 1 and 2 are incorporated herein by reference thereto.

The following analysis is given by the present inventor. In a case of using flash memory as data storage memory, as in EEPROM emulation, request of writing randomly to the flash memory occurs. The writing must be completed within a fixed time period, and in a case where a write request occurs during erasure of the flash memory, the erasure must be interrupted to perform the data writing.

In a case where the erasure is interrupted to perform data writing, and data erasure is restarted from the beginning, when an interval of data write requests is shorter than an erase pulse voltage application of FIG. 6 (step S101), there occurs a problem that the erasure of the flash memory is not completed. In order to avoid the problem, instead of performing the data erasure from the beginning, the erasure may be restarted from a point (midcourse) at which the data erasure was interrupted.

FIGS. 7B and 7C schematically show a distribution of threshold voltages of a memory cell and erase pulse voltage in a case where the data erasure is interrupted and restarted from the interrupted time point. Here, it is assumed that the data erasure is interrupted at a time point at which pulse voltages p1 to p3 has been applied (that is, at a time point at which the threshold voltage distribution is d3) (refer to FIG. 7B).

According to a conventional data erasing method, in a case where the data erasure is restarted, a pulse voltage p1 with a prescribed strength that is independent of a threshold voltage of the memory cell is applied to the memory cell (step S101). With reference to FIG. 7C, the threshold voltage distribution changes from the threshold voltage distribution d3 to the threshold voltage distribution e1 in this case.

The magnitude of the change from the threshold voltage distribution d3 to the threshold voltage distribution e1 is smaller than the magnitude of the change from the threshold voltage distribution d3 to the threshold voltage distribution d4 in FIG. 7A. That is, according to the conventional data erasing method, in a case of restarting the data erasure from the interruption point, there occurs a problem that it is not possible to apply the erase pulse voltage according to the threshold voltage of the memory cell, and the erase time after restarting the data erasure becomes longer.

Furthermore, in a case where time from interrupting the data erasure to restarting the data erasure is long, the threshold voltage of the memory cell varies. In such a case, according to the conventional data erasing method, there occurs a problem that it is not possible to apply the erase pulse voltage according to the threshold voltage of the memory cell. Thus there is much to be desired in the art.

Consequently, there is a need in the art to shorten the time required for the data erasure when data erasure of a flash memory is interrupted and restarted from the interrupted point.

According to a first aspect of the present invention, there is provided a flash memory comprising:
a memory cell(s);
a verification circuit that measures threshold voltage of the memory cell(s) by verifying an erased state of the memory cell(s); and
a power supply circuit that applies, to the memory cell(s), one or more pulse voltages whose initial pulse voltage has a strength that corresponds to the threshold voltage.

According to a second aspect of the present invention, there is provided a data erasing method of a flash memory, the method comprising:

measuring a threshold voltage of a memory cell(s) by verifying an erasure state; and applying, to the memory cell(s), one or not less than two pulse voltages whose initial pulse voltage has a strength that corresponds to the threshold voltage.

The present invention provides the following advantage, but is not restricted thereto.

The flash memory and the data erasing method of the same according to the present invention shortens the time required for the data erasure when data erasure of a flash memory is interrupted and restarted from the interrupted point.

BRIEF DESCRIPTION OF THE DRAWINGS

FIGS. 7A, 7B and 7C are drawings for describing a conventional data erasing method of a flash memory.

PREFERRED MODES

In the present disclosure, there are various possible modes, which include the following, but not restricted thereto.

A flash memory as the first aspect. (Mode 1)

The verification circuit may measure the threshold voltage of the memory cell(s) by verifying an erased state of the memory cell(s) when data erasure is interrupted and restarted from the interrupted point. (Mode 2)

The flash memory may further comprise:

a register that records strength of a last pulse voltage applied to the memory cell(s) before the data erasure is interrupted; wherein the power supply circuit may use, as an initial pulse voltage, the pulse voltage with the strength recorded in the register when the data erasure is restarted from the interrupted point. (Mode 3)

A data erasing method of a flash memory as the second aspect. (Mode 4)

The data erasing method may comprise the measuring and the applying when data erasure of a flash memory is interrupted and restarted from the interrupted point. (Mode 5)

FIRST EXEMPLARY EMBODIMENT

Figure 1:
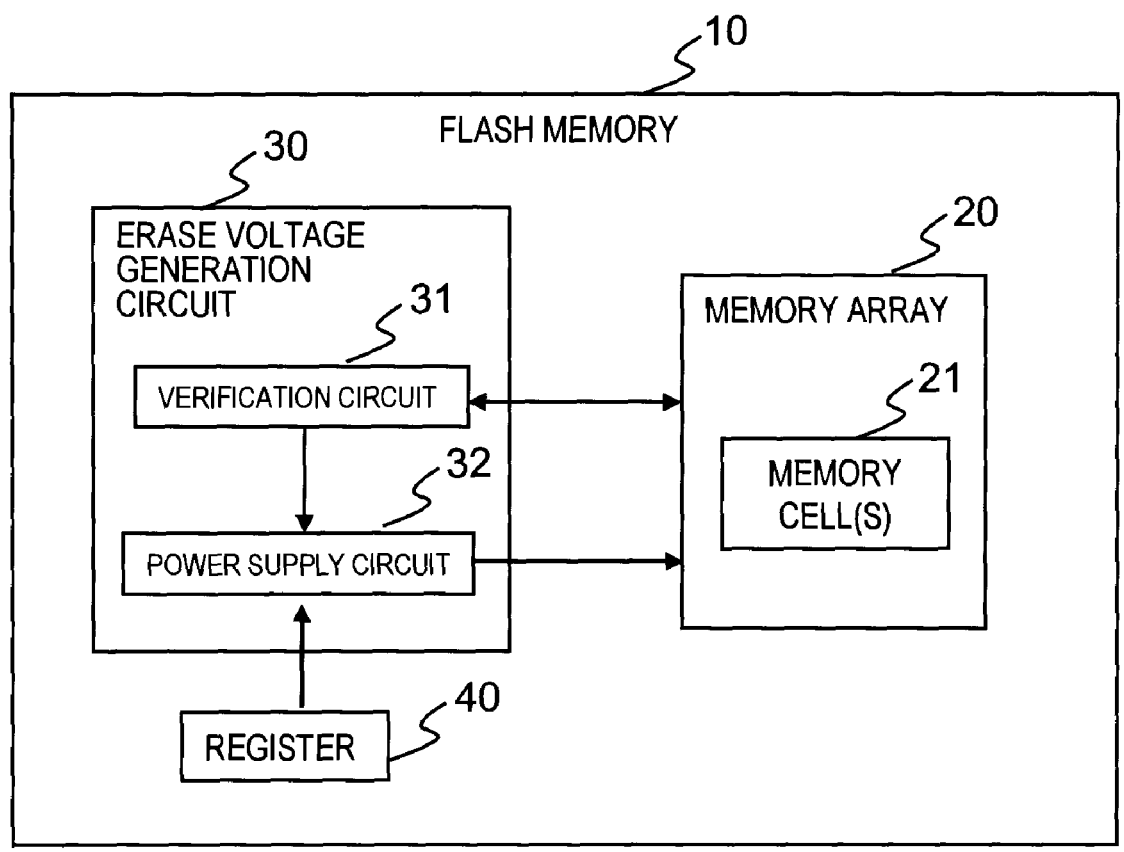
FIG. 1 is a block diagram showing a configuration of a flash memory according to a first exemplary embodiment.

A flash memory according to a first exemplary embodiment is described with reference to the drawings. FIG. 1 is a block diagram showing a configuration of a flash memory according to the present exemplary embodiment.

Referring to FIG. 1, a flash memory 10 includes a memory array 20 with one or more memory cells (may be collectively termed as "memory cell" hereinafter) 21, and an erase voltage generation circuit 30. The erase voltage generation circuit 30 further includes a verification circuit 31 and a power supply circuit 32.

The verification circuit 31 measures a threshold voltage of the memory cell 21 by verifying an erased state of the memory cell 21. The power supply circuit 32 applies, to the memory cell 21, one or not less than two pulse voltages whose initial pulse voltage has a strength that corresponds to the measured threshold voltage.

In this case, it is possible to apply, to the memory cell, an erase pulse voltage whose initial value has a strength that corresponds to the threshold voltage of the memory cell 21 and it is possible to shorten the erase time.

Furthermore, when data erasure is interrupted and restarted from the interrupted point, the verification circuit 31 preferably measures the threshold voltage of the memory cell 21 by verifying an erased state of the memory cell 21.

The reason is that, even in a case where a threshold voltage of each memory cell changes during the period from the interruption of the data erasure of the flash memory to the restarting of the data erasure, it is possible to apply a preferable erase pulse voltage to each memory cell, and it is possible to shorten the erase time when the erasure is restarted.

The flash memory 10 preferably further includes a register 40. The register 40 records the strength of the last pulse voltage applied to the memory cell 21 before the data erasure is interrupted. The power supply circuit 32, when the data erasure is restarted from the interrupted point, preferably uses a pulse voltage with the strength recorded in the register 40 as an initial pulse voltage.

The reason is that, in a case where the change of the threshold voltage of the memory cell is small during the period from the interruption of the data erasure to the restarting, it is possible to shorten the time required for determination of the threshold voltage of the memory cell.

SECOND EXEMPLARY EMBODIMENT

Figure 2:
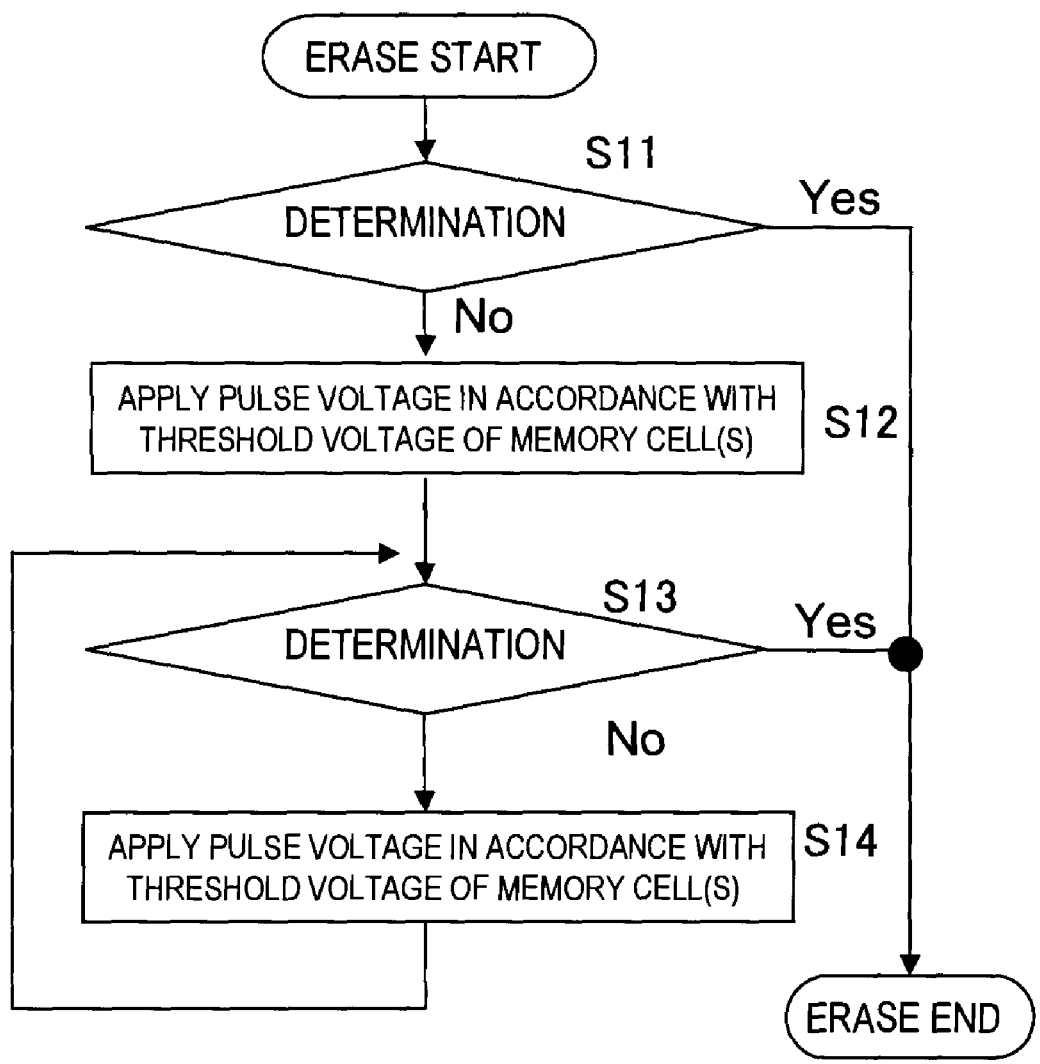
FIG. 2 is a flow chart of a data erasing method of a flash memory according to a second exemplary embodiment.

A second exemplary embodiment is described in detail with reference to the drawings. FIG. 2 is a flow chart showing an erasing method of a flash memory according to the present exemplary embodiment. With reference to FIG. 2, after starting erasure, an erase verify operation is performed in order to determine a threshold voltage of the flash memory (step S11). Therefore, an erase pulse voltage applied initially (step S12) becomes a preferred voltage corresponding to a threshold voltage of a memory cell.

Figure 3:
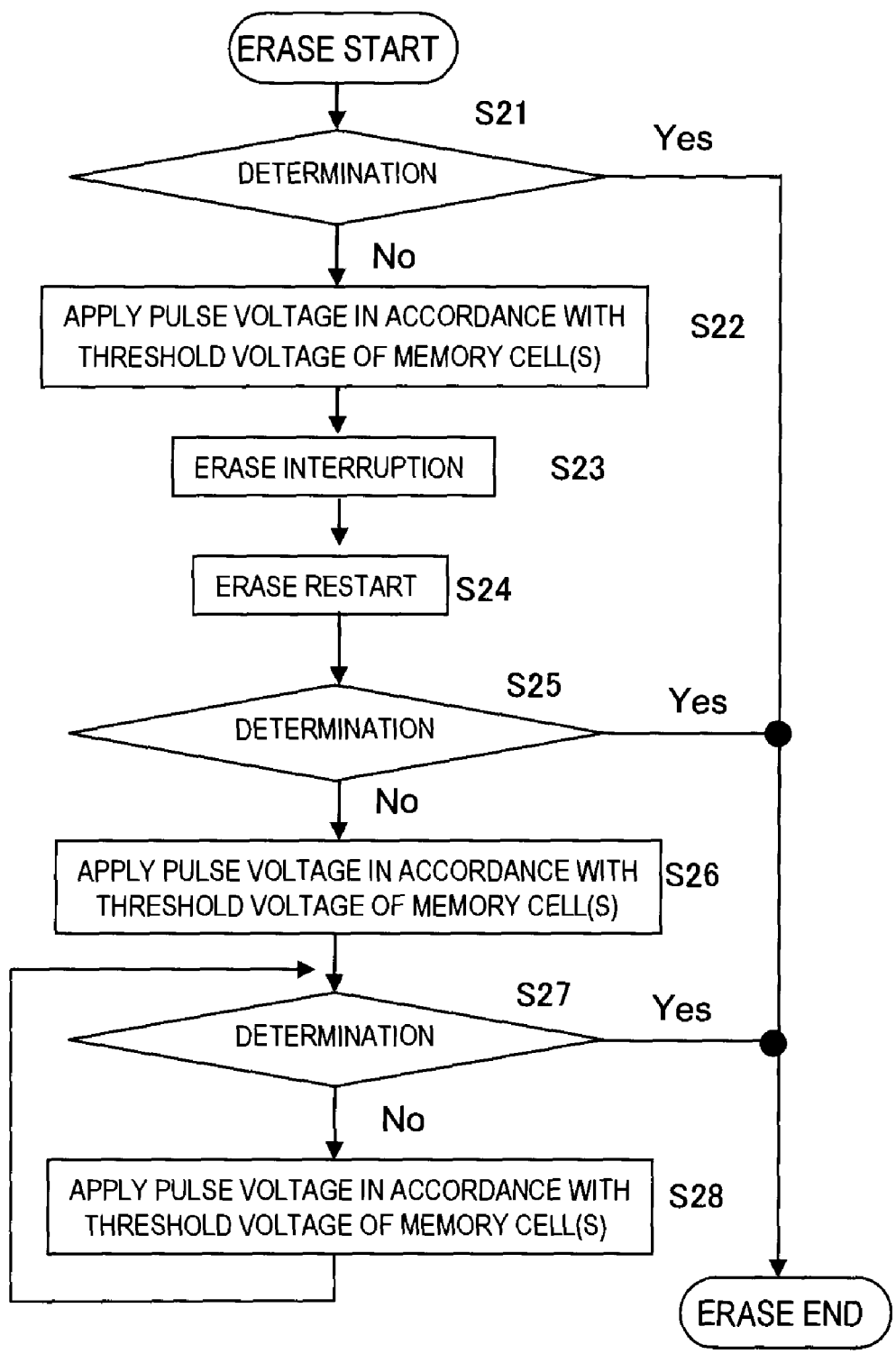
FIG. 3 is a flow chart of the data erasing method of a flash memory according to a second exemplary embodiment.

Next, an operation in a case where data erasure is interrupted and restarted is described. FIG. 3 is a flow chart of a case where erasure is interrupted during application of the erase pulse voltage and restarted. With reference to FIG. 3, the erasure is interrupted during application of the erase pulse voltage in step S22 (step S23), and when the erasure is restarted thereafter (step S24), the threshold voltage is determined at first (step S25). Next, a pulse voltage of a strength corresponding to the threshold voltage is applied (step S26).

In a case where the erasure is already completed (Yes in step S27), the erasure is ended. In a case where the erasure is not completed (No in step S27), a preferred erase pulse voltage corresponding to the threshold of the memory cell is applied (step S28).

In this way, by determining a threshold voltage of a memory cell after restarting erasing, data erasure can be restarted with a preferable erase pulse voltage as an initial pulse voltage that corresponds to the memory cell threshold voltage before erase interruption or to the threshold voltage that has changed due to deterioration of the memory cell during the period from the erase interruption to restarting.

Next, in a case where the cell threshold voltage is appropriately distributed, a description is given concerning a state of change of the threshold voltage and the pulse voltage when the data erasing method of the present exemplary embodiment is used, and a state of change of the threshold voltage and the pulse voltage when a conventional data erasing method is used, with reference to the drawings.

Figure 4A:
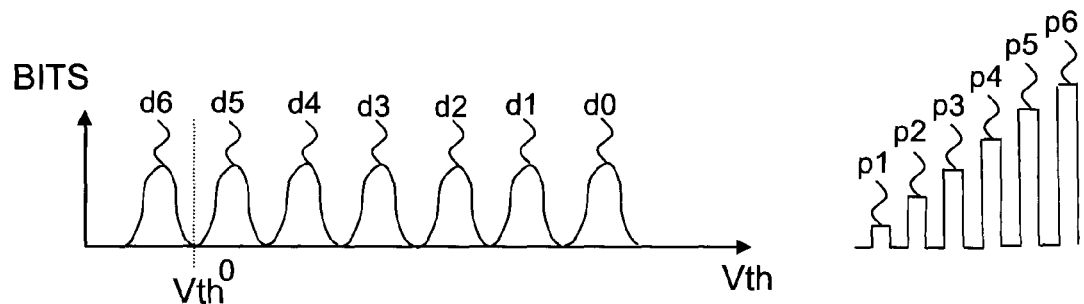
FIGS. 4A, 4B and 4C are drawings for describing the data erasing method of a flash memory according to a second exemplary embodiment.
Figure 4B:
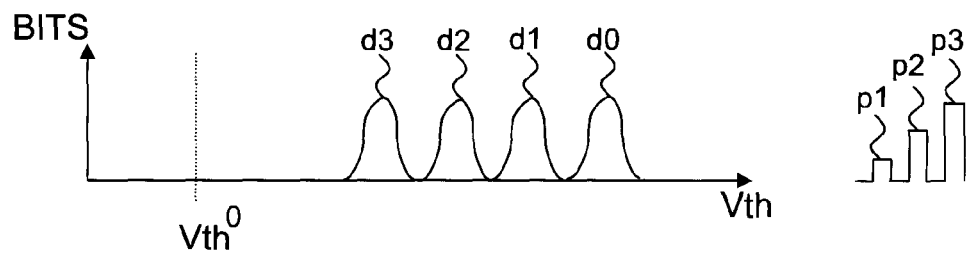
Figure 4C:
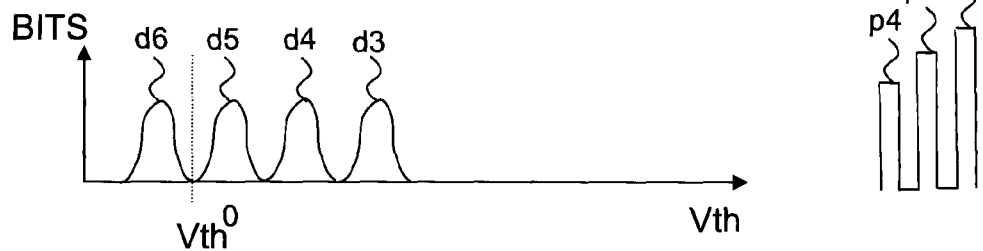

FIGS. 4A-4C are drawings for describing a data erasing method of a flash memory according to the present exemplary embodiment. FIGS. 4A-4C show a case where the distribution of the memory cell threshold voltage does not change during the period from the interruption of data erasure to the restarting of the data erasure (that is, the period from the interruption to the restarting is short).

FIGS. 4A to 4C schematically show the memory cell threshold voltage distribution, and data erase pulse voltage. With reference to FIG. 4A, the threshold voltage distribution d0 is a threshold voltage distribution of the memory cell before starting data erasure. By applying a pulse voltage p1 (step S12) corresponding to the threshold voltage, to the memory cell, the threshold voltage distribution changes from the threshold voltage distribution d0 to a threshold voltage distribution d1.

Next, by successively applying pulse voltages p2 to p6 corresponding to the threshold voltage (step S14), the threshold voltage distribution successively changes to the threshold voltage distributions d2 to d6. Since the threshold voltage distribution d6 is not greater than the erase level Vth0 (Yes in step S13) when the threshold voltage of the memory cell is determined at a point in time at which the threshold voltage distribution is d6 (step S13), the memory cell is regarded as being in an erased state, and the data erasure is completed.

Next, a description is given concerning a case where the data erasure is interrupted and restarted from the interruption point. FIGS. 4B and 4C schematically show the memory cell threshold voltage distribution and data erase pulse voltage in a case where the data erasure is interrupted and restarted from the interruption point. Here, it is assumed that the data erasure is interrupted when pulse voltages p1 to p3 has been applied (that is, when the threshold voltage distribution is d3) (refer to FIG. 4B).

Since measurement of the threshold voltage by verification of the erased state is performed at first (step S25) when the data erasure is restarted (step S24) according to the data erasing method of the present exemplary embodiment, a pulse voltage p4 with a strength corresponding to the memory cell threshold voltage is applied to the memory cell (step S26). With reference to FIG. 4C, the threshold voltage distribution changes from the threshold voltage distribution d3 to the threshold voltage distribution d4 in this case.

The magnitude of the change from the threshold voltage distribution d3 to the threshold voltage distribution d1 is identical to the magnitude of the change from the threshold voltage distribution d3 to the threshold voltage distribution d4 in FIG. 4A. That is, according to the data erasing method of the present exemplary embodiment, in a case of restarting the data erasure from the interrupted point, it is possible to apply the erase pulse voltage corresponding to the threshold voltage of the memory cell, and it is possible to make the erase time after restarting the data erasure shorter than that in a conventional case.

Next, the method of the present exemplary embodiment and a conventional method are compared for a case where there the distribution of the memory cell threshold voltage changes during the period from the interruption of the data erasure to the restarting of the data erasure. FIGS. 5A-5D are drawings for describing a data erasing method of a flash memory according to the present exemplary embodiment. FIGS. 5A-5D show a case where the distribution of the memory cell threshold voltage changes during the period from the interruption of the data erasure to the restarting of the data erasure (that is, the period from the interruption to the restarting is long).

Figure 5A:
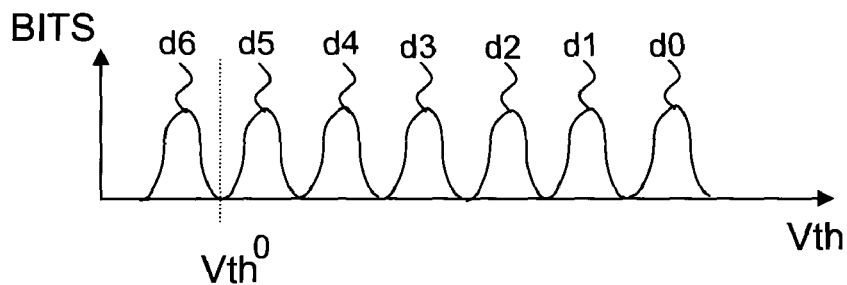
FIGS. 5A, 5B, 5C and 5D are drawings for describing a data erasing method of a flash memory according to a second exemplary embodiment.

FIGS. 5A to 5D schematically show the memory cell threshold voltage distribution and data erase pulse voltage. With reference to FIG. 5A, the threshold voltage distribution d0 is a threshold voltage distribution of the memory cell before starting data erasure. By sequentially applying pulse voltages p1 to p6 to the memory cell, the threshold voltage distribution sequentially changes to the threshold voltage distributions d1 to d6. At a time point in time at which the threshold voltage distribution is d6, the threshold voltage distribution is not greater than the erase level Vth0, and the memory cell is in an erased state.

Figure 5B:
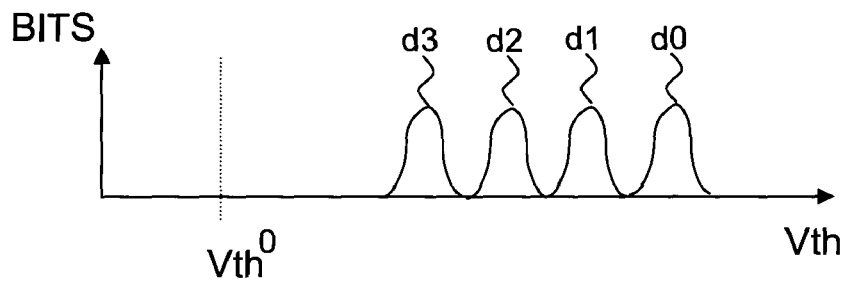
Figure 5C:
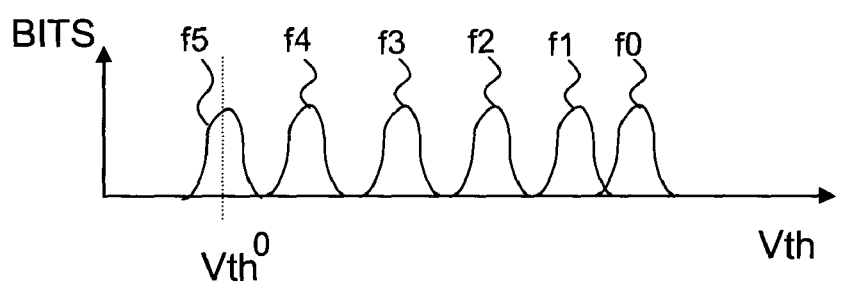
Figure 5D:
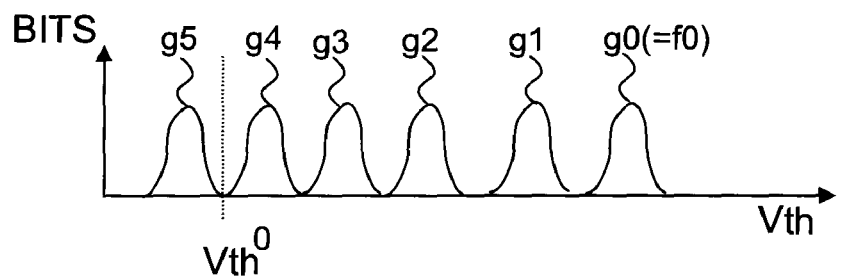
Figure 6:
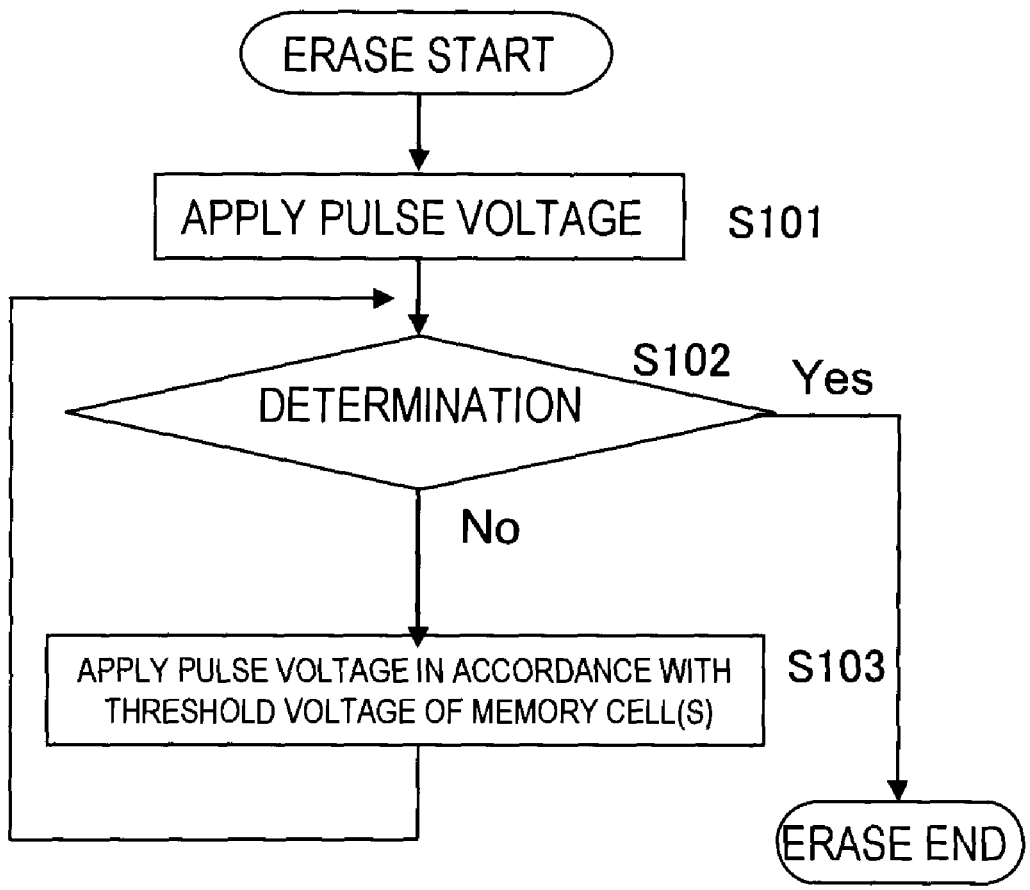
FIG. 6 is a flow chart of a conventional data erasing method of a flash memory.

Next, a description is given concerning a case where the data erasure is interrupted and restarted from the interruption point. FIGS. 5B to 5D schematically show the memory cell threshold voltage distribution and data erase pulse voltage in a case where the data erasure is interrupted and restarted from the interruption point. Here, it is assumed that the data erasure is interrupted when the pulse voltages p1 to p3 have been applied (that is, time point at which the threshold voltage distribution is d3) (refer to FIG. 5B).

In a case where the period from the interruption of the data erasure to the restarting of the data erasure is long, the distribution of the memory cell threshold voltage may change. Here, it is assumed that, at the time point at which the data erasure is restarted, the threshold voltage distribution d3 changes to the threshold voltage distribution f0 or g0 (=f0) (FIGS. 5C and 5D).

FIG. 5C schematically shows the threshold voltage distribution and the pulse voltage for a case where a conventional data erasing method is employed. With reference to FIG. 5C, in the conventional data erasing method, in a case where the data erasure is restarted, a pulse voltage P1 of a prescribed strength that is independent of the threshold voltage of the memory cell is applied to the memory cell (step S101). With reference to FIG. 5C, the threshold voltage distribution changes from the threshold voltage distribution f0 to the threshold voltage distribution f1 in this case.

FIG. 5D schematically shows the threshold voltage distribution and the pulse voltage for a case where the data erasing method of the present exemplary embodiment is employed. With reference to FIG. 5D, since measurement of the threshold voltage by verification of the erased state is performed at first (step S25) when the data erasure is restarted (step S24) in the data erasing method of the present exemplary embodiment, a pulse voltage q1 of a strength corresponding to the memory cell threshold voltage is applied to the memory cell (step S26). With reference to FIG. 5D, the threshold voltage distribution changes from the threshold voltage distribution g0 to the threshold voltage distribution g1 in this case.

A magnitude of the change from the threshold voltage distribution g0 to the threshold voltage distribution g1 is larger than a magnitude of the change from the threshold voltage distribution f0 to the threshold voltage distribution f1 in FIG. 5C. That is, according to the data erasing method of the present exemplary embodiment, in a case of restarting the data erasure from the interruption point, it is possible to apply the erase pulse voltage corresponding to the threshold voltage of the memory cell, and it is possible to make the erase time after restarting the data erasure shorter than that in the conventional case.

According to the abovementioned description, by determining the threshold voltage of the memory cell at first and applying to the memory cell an erase pulse voltage that corresponds to the determination result when the erasure is started, even in a case where the period from the interruption of the erasure to the restarting is long and the threshold voltage of the memory cell changes, it is possible to restart the data erasure at a preferred erase voltage.

THIRD EXEMPLARY EMBODIMENT

A third exemplary embodiment is described with reference to the drawings. A flash memory of the present exemplary embodiment includes a register 40 similar to the abovementioned first exemplary embodiment (FIG. 1). The register 40 stores the strength of an erase pulse voltage applied to the memory cell during the period from the interruption of the erasure to the restarting of the erasure.

In this case, in a determination when the erasure is restarted (step S27), it is possible to refer to a voltage when the erasure is interrupted. In particular, in a case where deterioration of a threshold voltage of the memory cell from the erase interruption to the erase restarting is small, it is possible to shorten the time required for the determination (step S27).

The above description has been given based on the exemplary embodiments, but the present invention is not limited to the abovementioned exemplary embodiments.

What is claimed is:

1. A flash memory comprising:
   at least one memory cell;
   a verification circuit configured to measure threshold voltage of said at least one memory cell by verifying an erased state of said at least one memory cell; and
   a power supply circuit configured to apply, to said at least one memory cell, one or more erase pulse voltages whose initial pulse voltage has a strength that corresponds to said threshold voltage.

2. The flash memory according to claim 1, wherein said verification circuit is configured to measure said threshold voltage of said at least one memory cell by verifying an erased state of said at least one memory cell when data erasure is interrupted and restarted from the interrupted point.

3. The flash memory according to claim 1, further comprising:
   a register configured to record strength of a last pulse voltage applied to said at least one memory cell before the data erasure is interrupted; wherein
   said power supply circuit is further configured to use, as an initial pulse voltage, said pulse voltage with said strength recorded in said register when the data erasure is restarted from the interrupted point.

4. A data erasing method of a flash memory, said method comprising:
   measuring a threshold voltage of at least one memory cell by verifying an erasure state; and
   applying, to said at least one memory cell, one or more erase pulse voltages whose initial pulse voltage has a strength that corresponds to said threshold voltage.

5. The data erasing method according to claim 4, comprising said measuring and said applying when data erasure of a flash memory is interrupted and restarted from the interrupted point.

6. A flash memory comprising:
   at least one memory cell;
   a verification circuit configured to measure threshold voltage of said at least one memory cell by verifying an erased state of said at least one memory cell when data erasure is interrupted and restarted from the interrupted point; and
   a power supply circuit configured to apply, to said at least one memory cell, one or more erase pulse voltages whose initial pulse voltage has a strength that corresponds to said measured threshold voltage.

* * * * *